United States Patent [19]

Kimura et al.

[11] Patent Number: 4,784,003
[45] Date of Patent: Nov. 15, 1988

[54] MECHANICAL QUANTITY SENSOR ELEMENT

[75] Inventors: Naomasa Kimura; Masayuki Nishiguchi; Minoru Noguchi, all of Saitama, Japan

[73] Assignee: Honda Giken Kogyo Kabushiki Kaisha, Tokyo, Japan

[21] Appl. No.: 1,406

[22] Filed: Jan. 8, 1987

[30] Foreign Application Priority Data

Jan. 10, 1986 [JP] Japan .................................. 61-2130
Sep. 10, 1986 [JP] Japan ................................ 61-211778
Sep. 10, 1986 [JP] Japan ................................ 61-211779
Sep. 10, 1986 [JP] Japan ................................ 61-211780

[51] Int. Cl.$^4$ ............................................. G01L 1/12
[52] U.S. Cl. ............................ 73/862.36; 73/DIG. 2; 324/209
[58] Field of Search ...................... 73/862.36, DIG. 2; 324/209

[56] References Cited

U.S. PATENT DOCUMENTS 3,313,675  4/1967  Petropoulos et al. ......... 156/330 X
4,627,298 12/1986  Sahashi et al. .................. 73/862.36
4,631,796 12/1986  Inomata et al. ............. 73/862.36 X

OTHER PUBLICATIONS

Sasada, I. et al., A New Method ... Amorphous Ribbons, IEEE Transactions, vol. Mag.-19, No. 5, Sep. 1983, pp. 2148-2150.

Primary Examiner—Jerry W. Myracle
Attorney, Agent, or Firm—Lyon & Lyon

[57] ABSTRACT

A mechanical quantity sensor element making use of a stress-magneto effect of noncrystalline magnetic alloy. This mechanical quantity sensor element is manufactured by coupling a piece of noncrystalline magnetic alloy having positive magnetostriction with another material such as, for example, thermo-setting resin at a temperature exceeding an operating temperature range of the mechanical quantity sensor element, and then cooling them to the operating temperature range. Due to a difference in a coefficient of thermal expansion between the piece and the material, compression strain is preliminarily given to the noncrystalline magnetic alloy piece, and the mechanical quantity sensor element has an excellent linearity and a wide detectable range for mechanical quantities.

4 Claims, 16 Drawing Sheets

F I G. 1
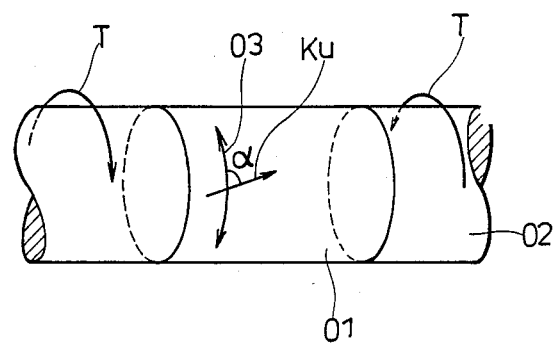
F I G. 2
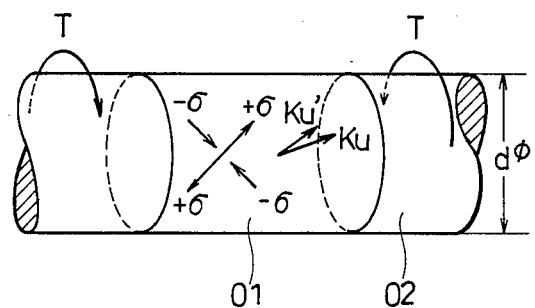

F I G. 3
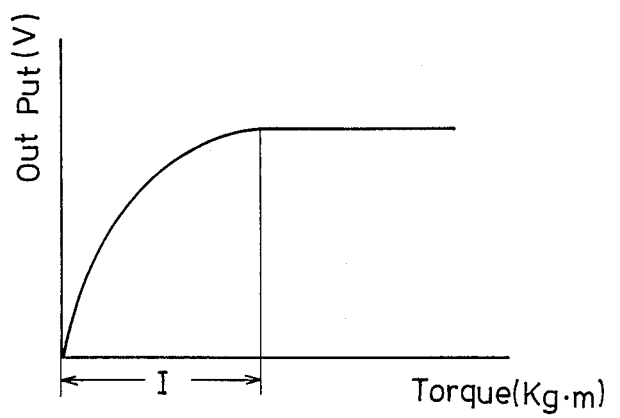
F I G. 4
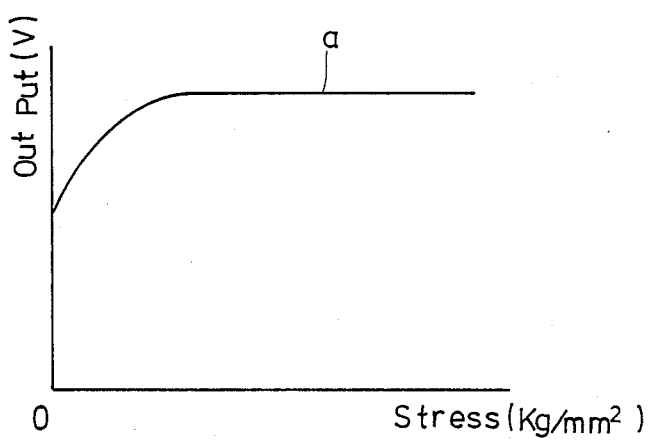

F I G. 11
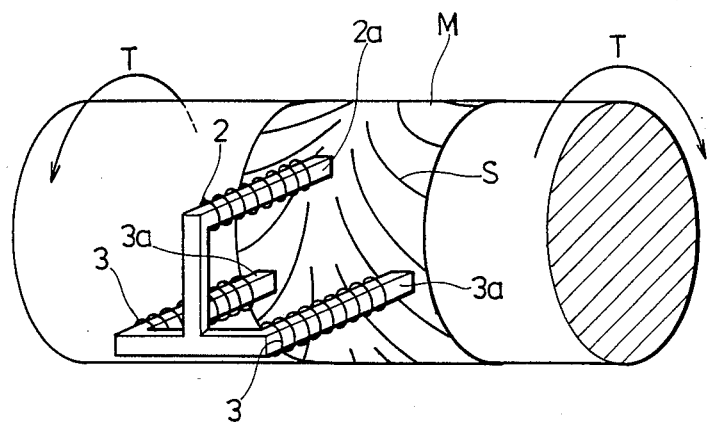
F I G. 12
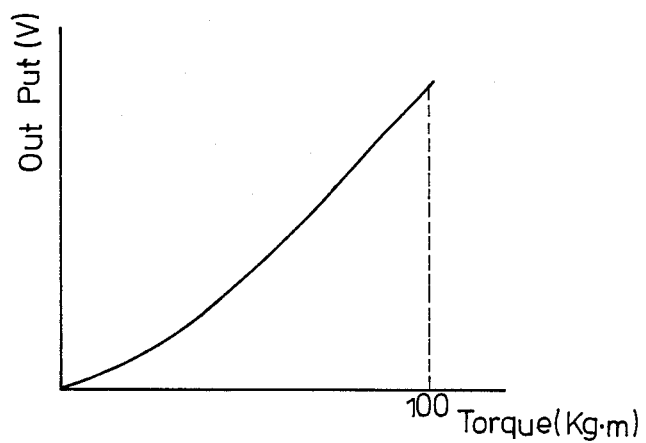

F I G. 13
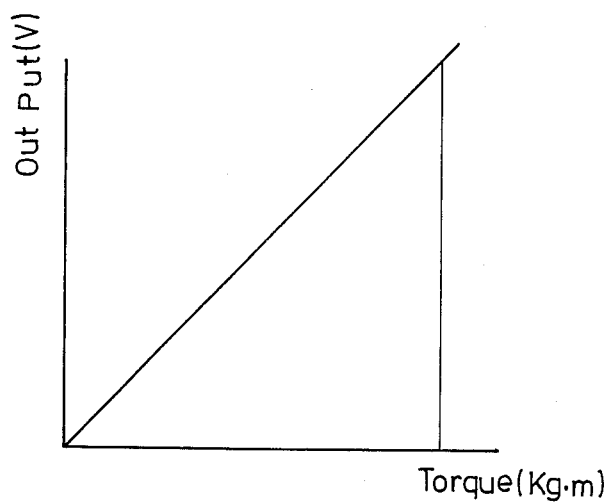
F I G. 14
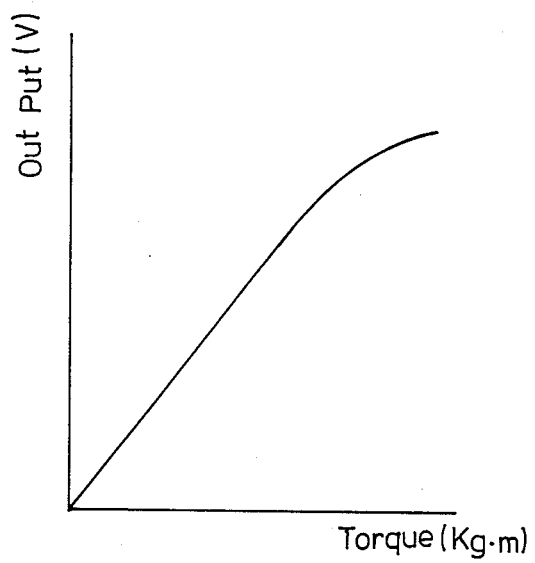

F I G. 17
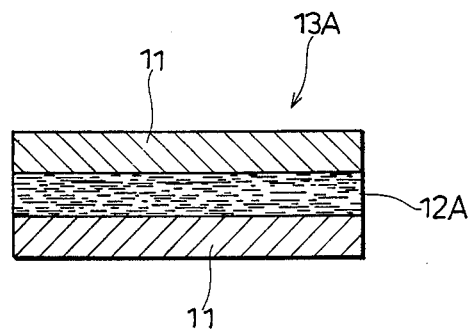
F I G. 18
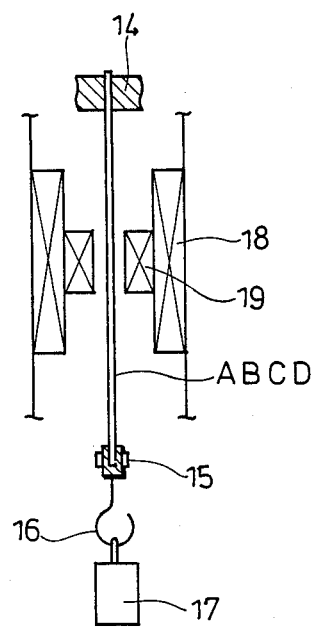

F I G 21
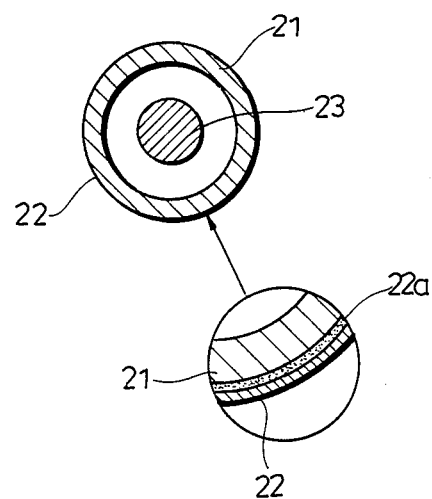

F I G. 22
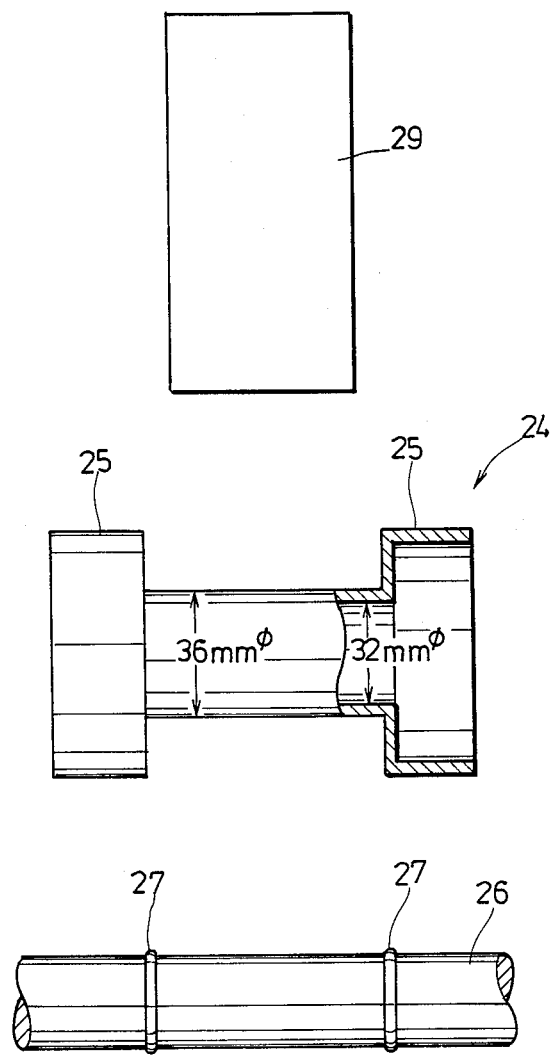

F I G. 25
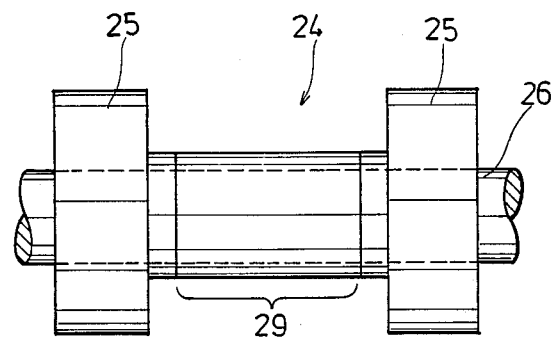
F I G. 26
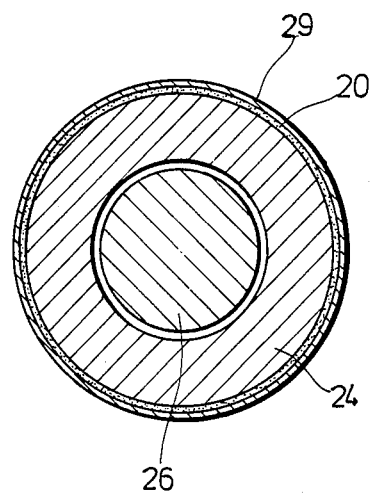

F I G. 30
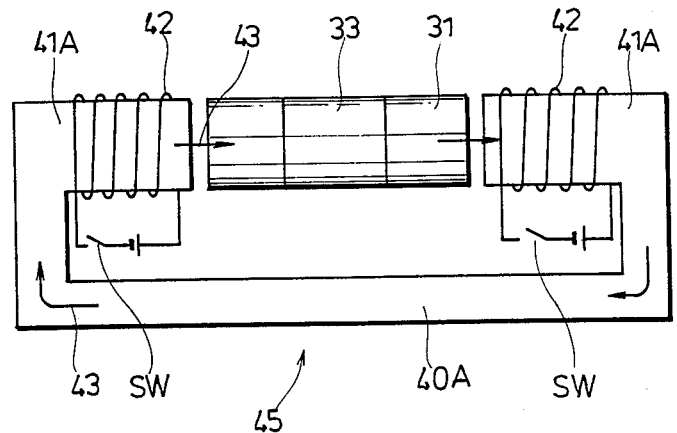
F I G. 31
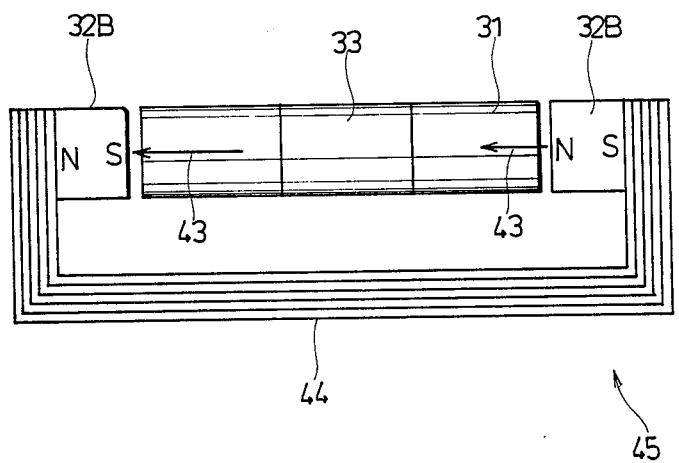

MECHANICAL QUANTITY SENSOR ELEMENT

BACKGROUND OF THE INVENTION

The present invention relates to a mechanical quantity sensor element making use of a stress-magneto effect of noncrystalline magnetic alloys (amorphous magnetic alloys) and a method for making the same.

Among the mechanical quantity sensors for measuring a force, a torque or the like, a sensor making use of a stress-magneto effect of noncrystalline magnetic alloys has been marketed in recent years. This type of mechanical quantity sensors afford the advantages that ① non-contact sensing of a force is possible, ② conversion of a force into an electrical quantity can be achieved directly, ③ a device structure of the sensor is simple and hence reduction in size thereof can be realized, and ④ noncrystalline magnetic alloys are materials having a high strength and a high stiffness, which are excellent in corrosion resistance and perfect elastic materials, and therefore, they are excellent in resistance to environment conditions and can withstand a wide scope of working conditions.

By way of example, as shown in FIG. 1, there is known a torque sensor in which a ribbon 01 made of noncrystalline magnetic alloy having positive magnetostriction, that is sensitive in a stress-magneto effect, is wrapped around a rotary shaft 02 so that "torsion strain" generated in the rotary shaft 02 by a torque T may be introduced into the ribbon 01, change of magnetic characteristics of the ribbon 01 caused by the stress-magneto effect is sensed, and thereby the torque T can be sensed. In noncrystalline magnetic alloy having positive magnetostriction, there occurs a phenomenon that if a tensile stress is applied to that alloy, magneto-elastic energy in the direction of the tensile stress is lowered and in that direction magnetization becomes easy. This phenomenon is called stress-magneto effect. In the above-referred torque sensor, a uniform easy magnetization axis (uniaxial magnetic anisotropy) Ku in the direction making an inclination angle $\alpha(\alpha>45°)$ with respect to a circumferential direction 03 is given to the entire surface of the thin belt 01 by making use of this stress-magneto effect. However, if a torque T is exerted upon the rotary shaft 02, then as shown in FIG. 2, a stress $\sigma$ represented by the equation $$\sigma = \frac{16}{\pi d^3} T$$

(where d represents an outer diameter of the rotary shaft 02) is generated in the direction making an angle $\pm 45°$ with respect to the axial direction of the rotary shaft 02, hence uniaxial magnetic anisotropy is induced also in the direction of $+\sigma$ due to the stress-magneto effect, and as a result, a combined easy magnetization axis Ku is given.

Now, on the basis of the fact that generally a magnetic permeability of a magnetic body would vary depending upon a direction of a easy magnetization axis relative to a direction of a magnetic field, the above-mentioned change of the easy magnetization axis (Ku→Ku) is acknowledged as a variation of a magnetic permeability, and thereby a magnitude of the torque T can be detected.

Therefore, if the variation of the magnetic permeability (or a magnetic induction) is detected as a voltage variation, for example, by means of a magnetizing coil (primary coil) and a detecting coil (secondary coil), a torque-output curve as shown in FIG. 3 can be obtained.

However, in the case of the normally used noncrystalline magnetic alloy, since a linearity of the torque-output curve is poor and a detectable range I for the mechanical quantity is narrow, the sensor element is limited to utilization as a sensor element in a low torque range. Also, a stress-output curve of the noncrystalline magnetic alloy is as shown in FIG. 4, where as a gradient of the curve is large in the proximity of stress=0, a sensitivity at that portion is very high. Therefore, due to the fact that the stress distribution produced in the thin belt 01 of FIG. 1 by uneven bonding forces upon bonding the thin belt 01 onto the surface of the rotary shaft 02 is not uniform, in the case where the torque exerted upon the rotary shaft 02 is zero, the sensor output which should be inherently zero, would be detected as a relatively large value because of difference in the stopping angle of the rotary shaft 02.

In addition, if the ribbon 01 is simply bonded onto the surface of the rotary shaft 02 by means of an adhesive, the wrapping tension of the ribbon 01 with respect to the rotary shaft 02 would not become uniform over the entire surface as a whole, the film thickness of the adhesive becomes uneven, and so, the state of deformation of the rotary shaft 02 cannot be precisely known.

SUMMARY OF THE INVENTION

One object of the present invention is to provide a mechanical quantity sensor element in which a linearity of a stress-magneto characteristic curve is excellent, a detectable range for a mechanical quantity is enlarged, a variation of a mechanical quantity over a wide range can be detected, and a gradient of the same characteristic curve in the proximity of stress=0 is generous.

The above-described object can be achieved by coupling or contactedly engaging a noncrystalline magnetic alloy piece with another material and thus providing a mechanical quantity sensor element in which compression strain is preliminarily given to at least a part of the noncrystalline magnetic alloy piece as a result of mutual correlation between the both materials.

The above-mentioned mechanical quantity sensor element is manufactured through the steps of coupling or contactedly engaging a surface of a noncrystalline magnetic alloy piece with another material at the state where a temperature of at least the other material exceeds an operating temperature range of the mechanical quantity sensor element to form an integral element, subsequently cooling the integral element to the operating temperature range, and thereby giving compression strain to at least a part of the noncrystalline magnetic alloy piece.

For example, in the case of noncrystalline magnetic alloy provided in the form of a ribbon through the steps of continuously feeding molten alloy onto a copper drum that is rotating at a high speed and then extremely quickly quenching the alloy, crystal grain boundaries are not present in its texture, it is a ferromagnetic material that is mechanically, chemically and electro-magnetically excellent as compared to the crystalline alloys in the prior art, and especially, noncrystalline magnetic alloy containing iron as a principal component presents an excellent linearity in the stress-magneto characteristics.

Now, since the above-described noncrystalline magnetic alloy is a material obtained by freezing a liquid structure, an atom distribution state thereof is similar to a liquid phase state, it has a low density as compared to a crystalline material (crystalline alloy), and hence an interatomic attraction is surmised to be large as compared to a crystalline material. According to this surmise, the value zero of stress on the characteristic curve a shown in FIG. 4 is a virtual value, and one can imagine that a curve b continuous to the characteristic curve a is latent, for example, as shown in FIG. 5. Hence, if it is possible to bring this portion of the latent curve b to the range of stress $\geq 0$ and thus obtain a characteristic curve c shown in FIG. 6, then the stress-magneto characteristics can be remarkably improved.

The inventors of this invention conducted experiments under the above-mentioned surmise, and as a result it was confirmed that by preliminarily giving compression strain (compression stress) to a noncrystalline magnetic alloy piece having positive magnetostriction the above-described characteristic curve c can be realized. In order to give compression strain, a method of applying a coating film having a thermal expansion (contraction) characteristic different from a noncrystalline magnetic alloy piece onto the surface of the noncrystalline magnetic alloy piece, and relatively obstructing a thermal deformation of the noncrystalline magnetic alloy piece with the jointed relation between the both layers, is simple. Here, what is to be kept in mind is the thermal expansion characteristics of the noncrystalline magnetic alloy.

For the purpose of reference, a coefficient of thermal expansion of Metglas 2605SC (trade name) made by Allied Company, Ltd. which is noncrystalline magnetic alloy was investigated, and a curve (temperature-coefficient of thermal expansion) as shown in FIG. 7 was obtained. It is to be noted that the above-mentioned 2605SC ribbon was that formed through a single roll process. As this ribbon is a ribbon prepared by quenching along its lengthwise direction, the measurement of the coefficient of thermal expansion was conducted with respect to the lengthwise direction. It is favorable to give compression stress to at least a part of the noncrystalline magnetic alloy piece by making use of such thermal expansion characteristics, for instance, by applying a thermo-setting resin film having a setting temperature of 93° C. to the alloy piece. The noncrystalline magnetic alloy piece applied with the thermo-setting resin film is heated up to a setting temperature of that resin exceeding an operating temperature range of a mechanical quantity sensor element (a normal mechanical quantity sensor element is used at a room temperature of about 25° C., and therefore the operating temperature implies a temperature in the proximity of 25° C.) to harden the resin, and the obtained piece with a coating film could be returned to the operating temperature at which it is employed as a mechanical quantity sensor element. At that time, at the room temperature, while the noncrystalline magnetic alloy piece is to expand inherently according to the coefficient of thermal expansion in FIG. 7, since the expansion is suppressed by the thermo-setting resin film, compression stress is given to the noncrystalline magnetic alloy piece. It is to be noted that with respect to a Young's modulus of the used thermo-setting resin after setting, the larger it is, the more preferable is it.

BRIEF DESCRIPTION OF THE DRAWINGS

FIGS. 1 and 2 are schematic views for explaining a principle in the case of detecting a torque applied to a shaft by bonding a crystalline magnetic alloy piece to the circumference of the shaft;

FIG. 3 is a graph showing a torque-output curve as one example of measurement for a shaft torque by means of a torque sensor making use of a mechanical quantity sensor element made of noncrystalline magnetic alloy;

FIG. 4 is a graph showing a stress-magneto characteristic of noncrystalline magnetic alloy;

FIG. 11 is a perspective view of the same torque sensor;

FIG. 12 is a graph showing a torque-output curve that is obtained in the case of presetting a setting temperature of the resin adhesive for the above-mentioned thin film sheet at a relatively high temperature;

FIGS. 13 and 14, respectively, are graphs similar to FIG. 12 in the case where the setting temperature of the above-mentioned resin adhesive is chosen at relatively low temperatures as compared to the case illustrated in FIG. 12 (the setting temperature in the case of FIG. 13 being higher than that in the case of FIG. 14);

FIG. 17 is a cross-section view showing a mechanical quantity sensor element having a laminated structure in a completed state;

FIGS. 18 and 19, respectively, are schematic views showing apparatus for investigating stress-magneto characteristics of a mechanical quantity sensor element;

FIG. 21 is a cross-section view showing one preferred embodiment of the present invention in which a ribbon forming a mechanical quantity sensor element is wrapped around an outer circumference of a hollow body which forms an object of mechanical quantity sensing, and the ribbon is magnetically attracted by means of a magnet;

FIG. 22 is a side view showing the respective component members in FIG. 21 in a disassembled state;

FIG. 25 is a side view showing the state where a ribbon serving as a mechanical quantity sensor element is wrapped around an outer circumference of a main drum portion of a hollow cylinder;

FIG. 26 is a transverse cross-section view of the same;

FIGS. 29, 30 and 31, respectively, are schematic views showing a magnetic circuit construction for applying an external magnetic field to a circular bar having ribbons wrapped respectively therearound.

DETAILED DESCRIPTION OF PREFERRED EMBODIMENTS

Example 1

① A noncrystalline magnetic alloy piece (size:400 mm×7 mm×25 μm) formed of Metglas 2605SC (trade name) manufactured by Allied Company, Ltd. was prepared through a single roll process.

② An epoxy resin adhesive Alaldite XN 1244 (trade name) manufactured by Ciba-Geigy Co. (having a coefficient of thermal expansion of $10 \times 10^{-5}/°C$.) was applied over the entire surface on one side of the noncrystalline magnetic alloy piece, and after it was charged in a thermostatically controlled oven at a temperature of 150° C. to harden the resin adhesive, it was taken out of the thermostatically controlled oven and cooled naturally.

③ Then, stress-magneto characteristics (stress vs. output voltage(V)) of the prepared test piece were investigated through the same process as that described previously in connection to the characteristic curve in FIG. 3. The results are shown in FIG. 8.

<Evaluation>

Figure 5:
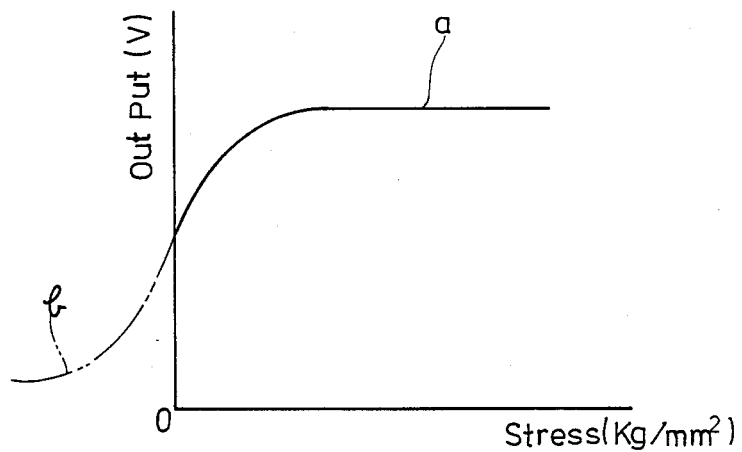
FIGS. 5 and 6 are graphs showing stress-magneto characteristics for explaining the principle of the present invention.
Figure 6:
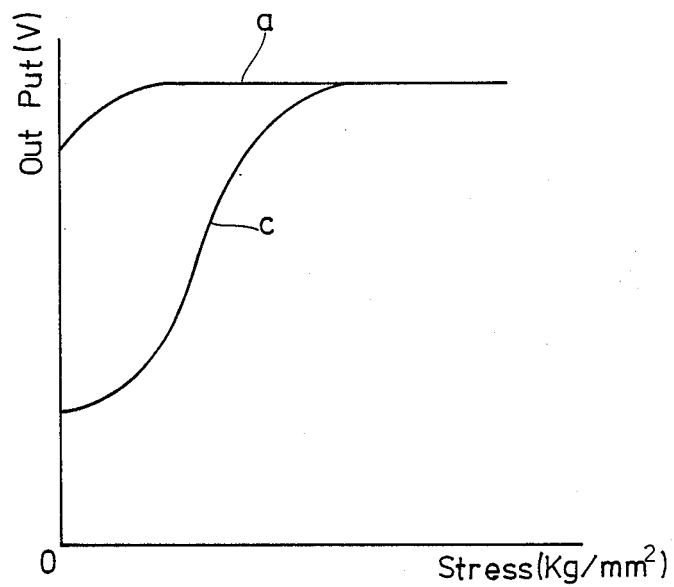
Figure 7:
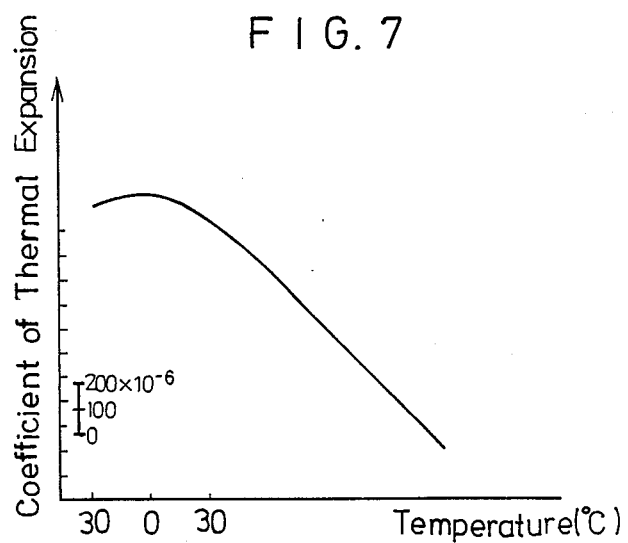
FIG. 7 is a graph showing a variation of a coefficient of thermal expansion of noncrystalline magnetic alloy 2605SC (trade name) depending upon a temperature.
Figure 8:
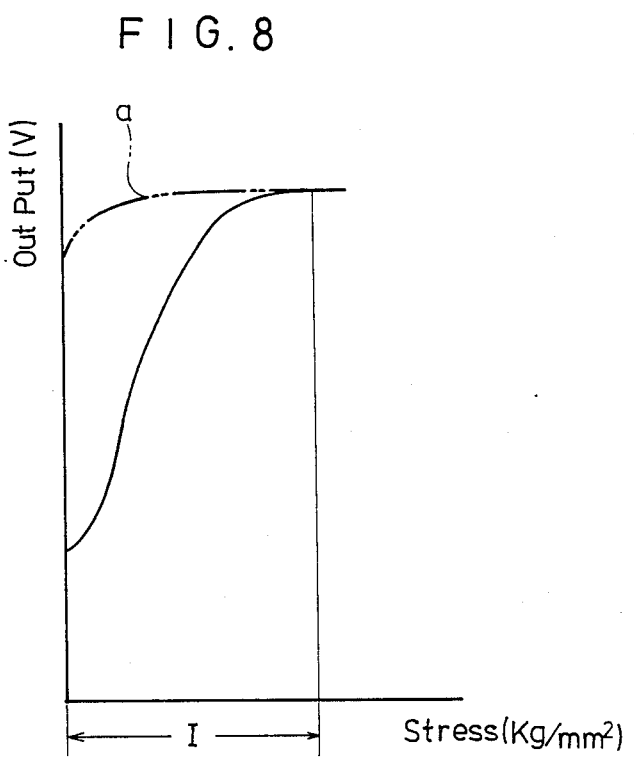
FIG. 8 is a graph showing a stress-magneto characteristic of the above-mentioned noncrystalline magnetic alloy 2605SC applied with compression stress.

The shape of the curve in FIG. 8 nearly conforms to the curve c in FIG. 6, and it can be seen that as compared to the curve a (See FIG. 4), application of compression stress is extremely effective.

Example 2

① A noncrystalline magnetic alloy piece M (size:50 mm width×25 μm thickness) formed of Metglas 2605SC (trade name) manufactured by Allied Company, Ltd. was prepared through a single roll process. In this noncrystalline magnetic alloy piece M are formed slits S (See FIG. 9).

Figure 10:
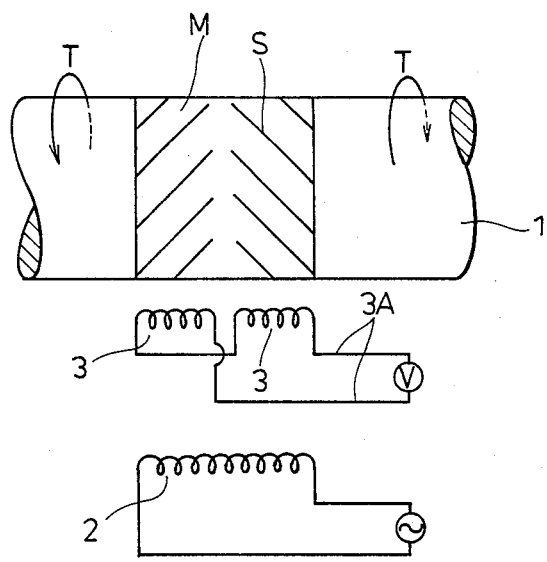
FIG. 10 is a schematic view showing a torque sensor formed by wrapping the same thin film sheet around a circumference of a shaft.

② An epoxy resin adhesive Alaldite XN 1244 (trade name) manufactured by Ciba-Geigy Co. was applied over the entire surface on one side of the noncrystalline magnetic alloy piece M, then it was adhesively wrapped around a circumference of a solid shaft 1 made of JIS SUS 304 (having a coefficient of thermal expansion of $17 \times 10^{-6}/°C$.) having a diameter of 27 mm$^\phi$ as shown in FIGS. 10 and 11, and it was charged in a thermostatically controlled oven at a temperature of 150° C. to harden the resin adhesive. Thereafter, the shaft 1 was taken out of the thermostatically controlled oven and cooled naturally.

③ Next, as shown in FIG. 11, magnetic cores 2a, 3a and 3a having a magnetizing coil 2 and detecting coils 3, 3 wound therearound were opposed to the surface of the noncrystalline magnetic alloy piece M at right angles and closely thereto, a high frequency current of 100 mA in effective value was fed to the magnetizing coil 2, and an induction voltage generated between terminal lines 3A of the detecting coils 3, 3 was investigated (It is to be noted that in FIG. 10 it is conceptually illustrated the arrangement of the magnetizing coil 2 and the detecting coils 3, 3). As described previously, this induction voltage would vary according to variation of a magnetic permeability of the noncrystalline magnetic alloy piece M, in other words, depending upon a magnitude of "stress/strain" introduced to the noncrystalline magnetic alloy piece M by a torque T applied to the shaft 1, and hence, the magnitude of the torque T can be known by measuring the induction voltage.

④ The thus obtained torque-output curve of the noncrystalline magnetic alloy piece M is shown in FIG. 12.

<Evaluation>

Also, it is seen that comparing FIG. 12 with FIG. 3, a gradient of the curve in the proximity of the torque T=0 in FIG. 12 becomes more generous, and so in contrast to the fact that a similar type of torque sensors in the prior art could measure a torque of, at maximum, only about 30 Kg.m, it becomes possible to measure even a torque of 100 Kg.m.

Example 3

A test piece obtained through a process similar to the steps ① and ② of Example 2 above, was charged in a thermostatically controlled oven at a temperature of 93° C. to harden the resin adhesive. Then, a torque-output curve as shown in FIG. 13 was obtained by employing a test piece that was taken out of the thermostatically controlled oven and cooled naturally, and measuring through a similar method to Example 1 above.

<Evaluation>

It is seen that the curve in FIG. 13 presents an excellent linearity and so it is possible to measure a large torque similarly to the case of Example 1 above. It is also seen that the difference between Example 2 and Example 3 is caused by the difference in the temperature at which the noncrystalline magnetic alloy piece is fixed, and the stress-magneto characteristic of the noncrystalline magnetic alloy would vary depending upon a magnitude (Example 2 >Example 3) of compression strain (compression stress) applied to the noncrystalline magnetic alloy piece.

Example 4

Measurement was done with respect to the case where the test piece was prepared similarly to Example 2 and Example 3 above but the setting temperature for the resin adhesive (the temperature of the thermostatically controlled oven) was chosen at 85° C., and a torque-output curve shown in FIG. 14 was obtained.

<Evaluation>

It is seen that in the curve shown in FIG. 14, a gradient of a curved portion becomes somewhat generous and a range of a straight portion becomes somewhat narrow as compared to the curve shown in FIG. 13, and as compared to FIG. 12 the curve is bent in the opposite direction. Further it is seen that in this case also a linearity is excellent and a range where a mechanical quantity is detectable is enlarged as compared to the torque sensors in the prior art, and hence that a wide range of torque can be measured.

Contrast

A resin adhesive that is different from the resin adhesive used in Example 2, Example 3 and Example 4 above, that is, an adhesive which is hardened at a room temperature (25° C.) (Alonalpha 201 (trade name) manufactured by Toa Gosei Company, Ltd.) was employed, but the conditions other than the hardening condition were made similar to Example 1, Example 2 and Example 3 above, and a torque-output curve shown in FIG. 15 was obtained.

<Evaluation>

Figure 15:
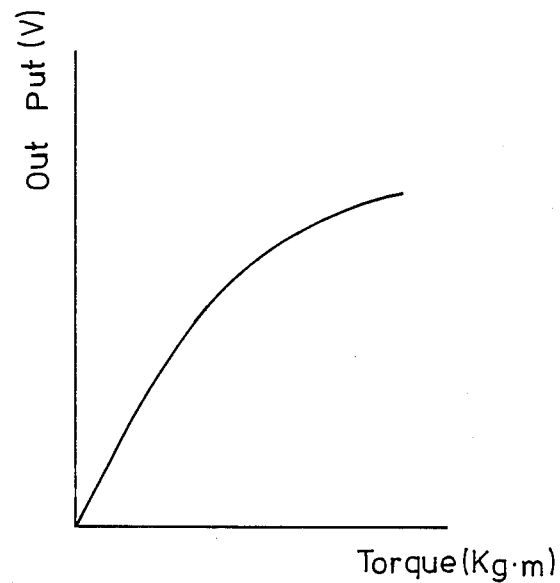
FIG. 15 is a graph showing a torque-output curve in the case where another resin adhesive is employed and a thin film sheet is bonded to a circumference of a shaft at a room temperature.

Since the temperature at which the noncrystalline magnetic alloy piece is fixed by a resin adhesive is a room temperature (25° C.), at the room temperature compression strain would not be given to the noncrystalline magnetic alloy piece, and so, the curve in FIG. 15 does not differ from the curve shown in FIG. 3.

While the present invention was practiced in a torque sensor in the above-described respective examples, the mechanical quantity sensor element making use of noncrystalline magnetic alloy is not only used as coupled or contactedly engaged with another member such as a shaft or the like, but also used as a single piece formed by applying another material such as the above-mentioned resin adhesive onto the noncrystalline magnetic alloy piece and solidifying the adhesive, and besides a fluid pressure sensor elements for sensing a gas pressure, an oil pressure, etc. and a strain sensor element, the same sensor element can be utilized as a mechano-electrical transducer element for controlling instruments.

In addition, in the case of providing a noncrystalline magnetic alloy piece, for instance, along an inner wall of a cylindrical body, bonding is not always necessitated, but if a noncrystalline magnetic alloy piece formed in a cylindrical shape is inserted and fitted within a heated cylindrical body and is then cooled, compression stress can be given to the non-crystalline magnetic alloy piece.

As will be apparent from the above-description, the mechanical quantity sensor element according to the present invention is such that a noncrystalline magnetic alloy piece is coupled or contactedly engaged with another material having a different coefficient of thermal expansion and compression strain is preliminarily given to at least a part of the noncrystalline magnetic alloy piece as a result of mutual correlation between the both materials. By giving the compression strain, stress-magneto characteristics of the noncrystalline magnetic alloy under the manufactured state (for instance, the very state where the alloy piece has been produced through a single roll process) can be remarkably improved, and since the characteristic curve is excellent in linearity and has an enlarged detectable range for a mechanical quantity, a wide range of stress can be detected.

Example 5

Figure 16:
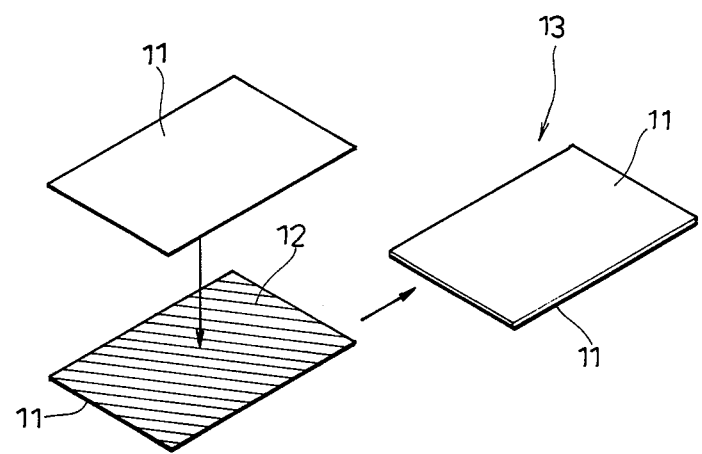
FIG. 16 is a schematic view for explaining a procedure of obtaining a mechanical quantity sensor element having a laminated structure.

① A plurality of ribbons 11 (size: 25 μm in thickness, 6mm in width) formed of noncrystalline magnetic alloy material Metglas 2605SC (trade name) (magnetostriction constant = $35 \times 10^{-6}$) manufactured by Allied Company, Ltd. were prepared through a single roll process (See FIG. 16).

② An epoxy resin adhesive Alaldite XN 1244 (trade name) (setting temperature 85° C., coefficient of thermal expansion $10 \times 10^{-5}/°$ C.) 12 manufactured by Ciba-Geigy Co. was applied to an entire surface on one side of the ribbon 11, another ribbon 11 that is not yet applied with the adhesive was jointed together, and thereby a laminated body 13 was formed as an intermediate product.

③ Three sets of formed laminated bodies 13 were separately charged in respective heating furnaces, and after the thermo-setting resin adhesive was hardened by heating them up to a temperature of 85° C., a temperature of 120° C. and a temperature of 150° C., respectively, they were cooled to a room temperature, FIG. 17 shows a laminated body finished as a complete product, that is, a mechanical quantity sensor element 13A, in which two ribbons 11 are integrally jointed by a thermo-setting resin adhesive layer 12A.

Figure 19:
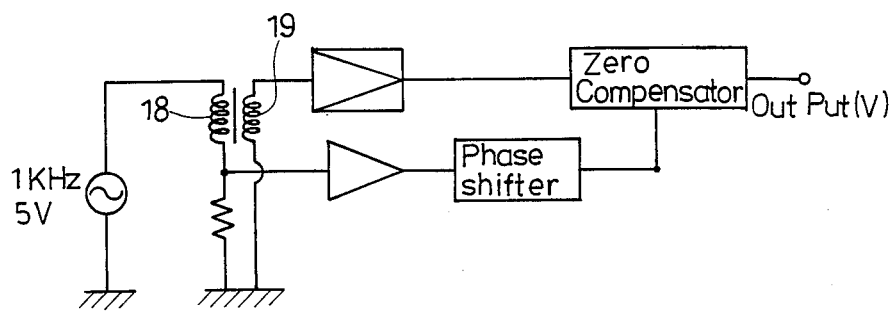

④ A simple ribbon 11 was named sample-A, a mechanical quantity sensor element 13A processed at a setting temperature of 85° C. was named sample-B, a mechanical quantity sensor element 13A processed at a setting temperature of 120° C. was named sample-C, a mechanical quantity sensor element 13A processed at a setting temperature of 150° C. was named sample-D, and with respect to these respective samples, stress-magneto characteristics were investigated by means of an apparatus shown in FIGS. 18 and 19. The results are shown as stress-output curves in FIG. 20.

In FIG. 18, reference numeral 14 designates a suspending tool which clamps an upper edge of the sample over its entire width, at the lower edge of the sample is mounted a clamp tool 15 associated with a hook 16, and a variable tensile force is applied to the sample by a weight 17 engaged with the hook 16.

On the opposite sides of the sample are disposed a magnetizing coil (primary coil:600 turns) 18 and a detecting coil (secondary coil: 1000 turns) 19, a sinesoidal alternating voltage of 1 KHz in frequency and 5V in effective value was applied to the magnetizing coil, an induction voltage (V) induced across the detecting coil 19 was used as an output value, and this output value was detected by a circuit arrangement shown in FIG. 19. As described previously, this induced voltage (output (V)) would vary according to variation of a magnetic permeability of the ribbon 11 which is a noncrystalline magnetic alloy piece, that is, depending upon a magnitude of a tensile stress applied to the ribbon 11 in the mechanical quantity sensor element 13A by the weight 17. Therefore, a magnitude of a tensile force (a load by the weight 17) can be known from the characteristic curves in FIG. 20 by measuring the induced voltage.

Figure 20:
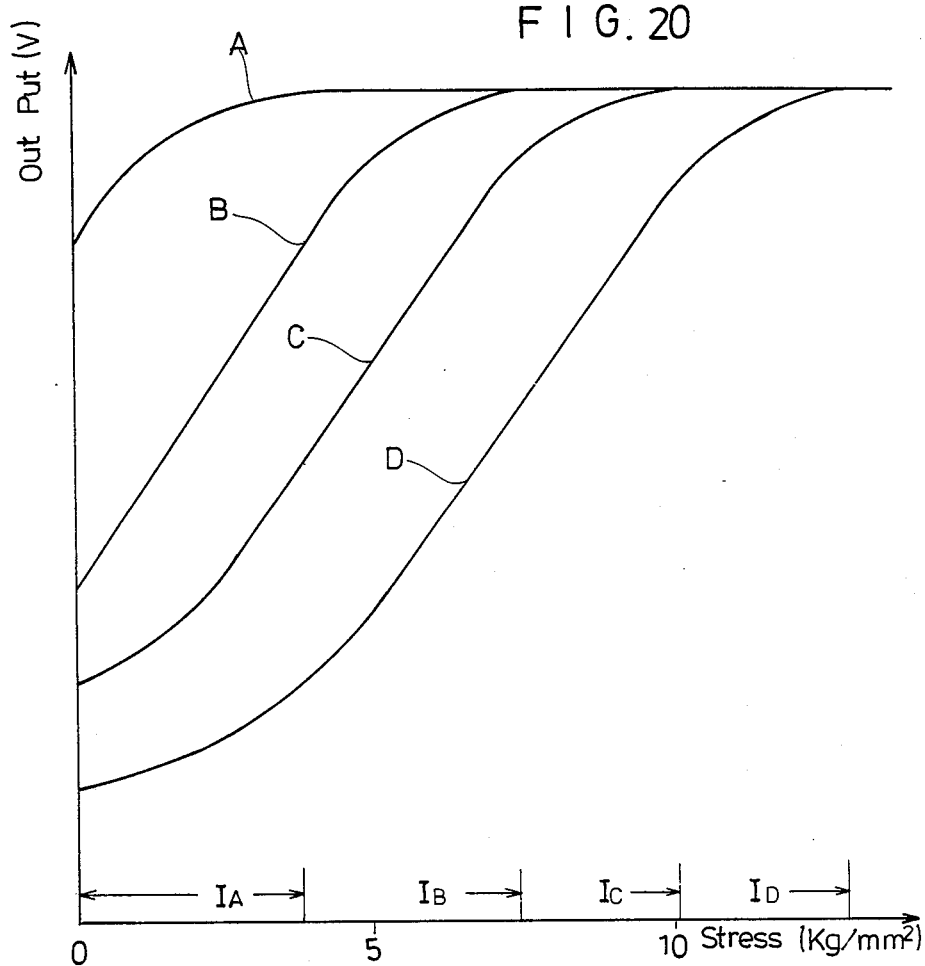
FIG. 20 is a graph showing stress-magneto characteristics of a known mechanical quantity sensor element and a mechanical quantity sensor element according to the present invention.

The stress-output curves in FIG. 20 were obtained by changing the load of the weight 17 and measuring the outputs (V) for each magnitude of the load with respect to the respective samples-A, -B, -C, and -D.

<Evaluation of Test Results>

① Comparing the characteristic curve for the sample-A with the characteristic curves for the sample-B, sample-C and sample-D, it is seen that by applying compression strain to the ribbon 11, a curve having a linear range enlarged similarly to curve C shown in FIG. 6 can be obtained (See Table-1).

② With respect to the samples-B, -C and -D, the compression strain is varied in the relation of B<C<D, thus the larger the compression strain is, the more shift the curve to the right, the more generous becomes the gradient of the curve in the proximity of stress=0, and hence the more increased the detectable range for stress I ($I_A<I_B<I_C<I_D$). Therefore, the magnitude of the compression strain is adjusted by selecting the heating temperature upon manufacturing the laminated body, and thereby mechanical quantity sensor elements 13A having different detectable ranges for stress I adapted for the object of detection of mechanical quantities can be provided (See Table-1).

TABLE 1

|   | Linear Range (Stress) | Detectable Limit Stress |
|---|---|---|
| A | 0~1.5 Kg/mm² | 4 Kg/mm² |
| B | 0~5 Kg/mm² | 7.5 Kg/mm² |
| C | 2~7 Kg/mm² | 10 Kg/mm² |
| D | 5~10 Kg/mm² | 13 Kg/mm² |

Assuming now that the curve D is chosen, then measurement having a little error in the proximity of stress=0 can be achieved. If the curve B is chosen, then since a linearity in the detectable range for stress $I_B$ is excellent, an auxiliary instrument for arithmetic operation becomes unnecessary.

As will be apparent from the above description, we have proposed:

① a mechanical quantity sensor element of laminated structure having stress-magneto characteristics whose linearity is excellent and whose detectable range for mechanical quantities is enlarged, which is constructed by integrally laminating a plurality of ribbons made of noncrystalline magnetic alloy having positive magnetostriction by the intermediary of a thermo-setting resin adhesive layer, in which isotropic compression strain is given to the respective ribbon due to the laminated and jointed relationship; and ② a method for making a mechanical quantity sensor element of laminated structure comprising of the steps of integrally laminating a plurality of ribbons made of noncrystalline magnetic alloy having positive magnetostriction by the intermediary of a thermo-setting resin adhesive layer in a unhardened state, heating the laminated body exceeding an operating temperature range of the mechanical quantity sensor element up to at least a setting temperature of the thermo-setting resin adhesive, holding it at that temperature to harden the thermo-setting resin adhesive, thereafter cooling it to the operating temperature range, and thereby giving isotropic compression strain to the respective ribbons.

Since the mechanical quantity sensor element according to the above-described example is a laminated structure making use of a plurality of ribbons, it can withstand a heavy load as compared to the case where a single ribbon is used, and so it is possible to enlarge a detectable range.

In addition, upon manufacturing the mechanical quantity sensor element, the higher the heating temperature for hardening the thermo-setting resin is set, the larger compression strain can be given to the ribbon which is a noncrystalline magnetic alloy piece, and since the stress-magneto characteristics of the mechanical quantity sensor element would vary depending upon a magnitude of compression strain, a mechanical quantity sensor element having a characteristic adapted to an object to be detected can be easily obtained.

Furthermore, according to the present invention, as shown in FIG. 21, under the state where a ribbon 22 is wrapped around a circumference of a hollow body 21, a magnet (permanent magnet or electromagnet) 23 which can exert uniform and symmetric lines of magnetic force upon the ribbon 22 is disposed within the hollow body 21 to cause the ribbon 22 magnetized by the lines of magnetic force to be magnetically attracted towards the magnet 23 (and to be adsorbed on the outer surface of the hollow body 21), thereby the thickness of the thermo-setting resin adhesive film 22a is made to be uniform over the entire circumference, and the thermo-setting resin adhesive could be hardened while maintaining this state, or else the magnet 23 could be disposed inside of the hollow body 21 prior to wrapping the ribbon 22 around the circumference of the hollow body 21, and the thermo-setting resin adhesive could be hardened through similar operations.

As a result, compression strain generated in the ribbon 22 and the thickness of the thermo-setting resin adhesive film become uniform over the entire circumference of the hollow body 21, and so, a state of deformation of the surface layer when a force is exerted upon the hollow body 21 can be detected at a high precision.

Also, as means for fixedly wrapping the ribbon 22 around the circumference of the hollow body 21, unhardening tacky material can be employed. In this case, in distinction from the thermo-setting resin adhesive it is impossible to give eventual compression strain to the ribbon 22, but by making the film thickness of the unhardening tacky material uniform by the action of the magnetic attractive force, the configuration of the surface of the hollow body which is an object of mechanical quantity measurement can be correctly reproduced by the mechanical quantity sensor element, and therefore, the state of deformation of the surface layer of the hollow body when a deforming force is exerted upon it can be detected at a good precision.

Example 6

① A hollow cylinder 24 (having larger diameter portions 25 at its opposite ends) made of JIS SUS 304 material which serves as an object of mechanical quantity measurement, a permanent magnet (ferrite magnet) 26 of round bar shape to be inserted to the inside of the hollow cylinder 24, and a rectangular ribbon 29 made of noncrystalline magnetic alloy (Metaglas 2605SC (trade name) manufactured by Allied Company, Ltd: magnetic permeability $\mu_{max}=3\times10^5$) having positive magnetostriction and a thickness of 25 μm to be wrapped around the outer circumference of a main drum portion of the hollow cylinder 24, were prepared (See FIG. 22).

The inner diameter of the main drum portion of the hollow cylinder 24 was 32 mmϕ and its outer diameter was 36 mmϕ.

Figure 23:
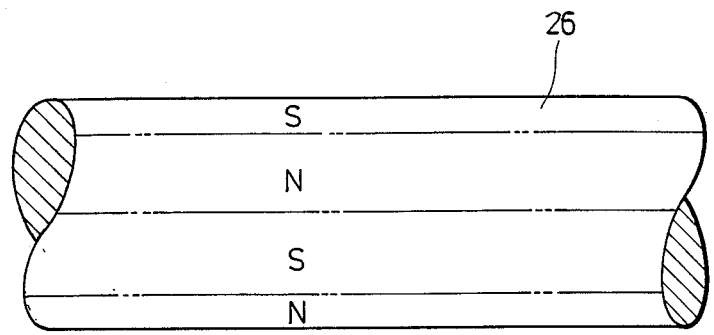
FIGS. 23 and 24, respectively, are a side view and a transverse cross-section view showing a state of magnetization of a bar permanent magnet.
Figure 24:
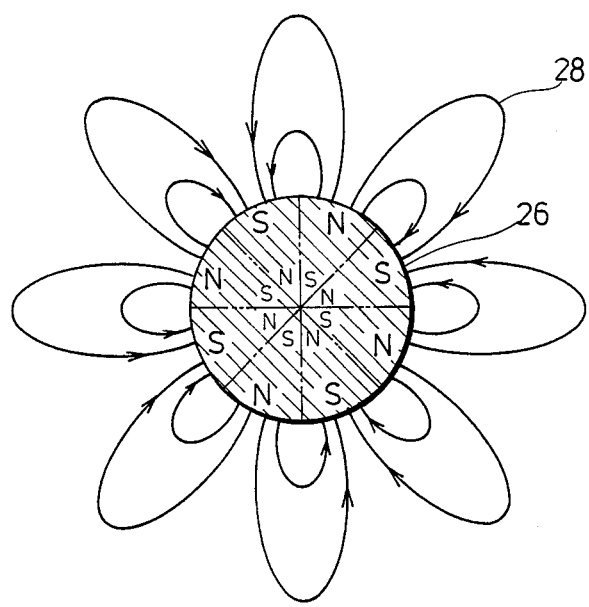

The permanent magnet 26 having a pair of rubber rings 27 fitted therearound is magnetized in an axis symmetric manner along the circumferential direction as shown in FIGS. 23 and 24, and therefore, lines of magnetic force 28 are generated also in an axis symmetric manner. These lines of magnetic force 28 have a component intersecting with the wall of the hollow cylinder 24 under the state where the permanent magnet 26 is inserted in the hollow cylinder 24.

② A thermo-setting resin adhesive (an epoxy resin adhesive Alaldite XN 1244(trade name) (coefficient of thermal expansion: $10\times 10^{-5}/°$ C.) manufactured by Ciba-Geigy Co.) was applied to the entire surface on one side of the ribbon 29, and as shown in FIG. 25 it was wrapped around the outer circumference of the main drum portion of the hollow cylinder 24.

③ The permanent magnet 26 was inserted into the hollow cylinder 24 so that their axes align with each other, and the ribbon 29 was adsorbed onto the outer surface of the hollow cylinder 24 by the action of the lines of magnetic field 28 (See FIG. 26:in this figure, reference numeral 20 designates a thermo-setting resin adhesive layer).

④ While the same state is maintained, all the members were charged in a heating furnace, after they were heated up to a temperature 120° C. exceeding a setting temperature (85° C.) of the thermo-setting resin adhesive and the thermo-setting resin adhesive layer 20 was hardened, they were taken out of the furnace and cooled naturally (See FIG. 27: a heating/cooling curve), and then the permanent magnet 26 was extracted from the hollow cylinder 24.

Through the above-mentioned procedure, the thermo-setting resin adhesive layer 20 can be hardened under the state where its thickness is made uniform over the entire circumference, and also uniform isotropic compression strain can be given to the entire area of the ribbon 29. When the stress-magneto characteristic (stress-output(voltage V)) was investigated with respect to the ribbon 29 which was given compression strain in a similar manner to that described previously in connection to FIG. 3, a curve having a generous gradient in the proximity of stress=0 and a wide detectable range for mechanical quantities, similarly to curve C in FIG. 6, was obtained. It is to be noted that in this case the given compression strain is isotropic, and is different from the torsion strain given to a ribbon, for instance, by wrapping the ribbon around a circumference of a shaft subjected to torsion, jointing them together, and thereafter releasing the torsion of the shaft as is the case with the prior art, and according to the process in the prior art, such characteristic curve cannot be obtained.

Example 7

Figure 28:
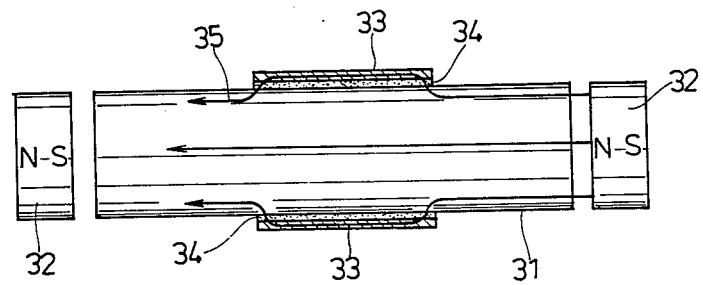
FIG. 28 is a cross-section view showing another preferred embodiment of the present invention.

① As shown in FIG. 28, a round bar 31 made of stainless steel (JIS SUS 360:magnetic permeability $\mu_{max}=95$) which serves as an object of mechanical quantity measurement, a pair of permanent magnets 32, 32 and a ribbon 3 made of noncrystalline magnetic alloy (Metglas 2605SC (trade name) manufactured by Allied company, Ltd: magnetic permeability $\mu_{max}=3\times 10^5$) having positive magnetostriction and a thickness of 25 μm, were prepared.

② A thermo-setting resin adhesive (an epoxy resin adhesive Alaldite XN 1244(trade name) (coefficient of thermal expansion: $10\times 10^{-5}/°$ C.) manufactured by Ciba-Geigy Co.) was applied to the entire surface on one side of the ribbon 33, and the ribbon 33 was wrapped around the outer circumference of the round bar 31 as shown in 29.

③ Subsequently, permanent magnets 32, 32 were disposed at the opposite ends of the round bar 31 with different magnetic poles faced to the end surfaces, and the ribbon 33 was magnetically attracted to the round bar 31 by the action of the internal magnetic field generated in the round bar 31 and the ribbon 33 (In FIG. 28, reference numeral 34 designates a thermo-setting resin adhesive layer, and numeral 35 designates lines of magnetic force).

Figure 27:
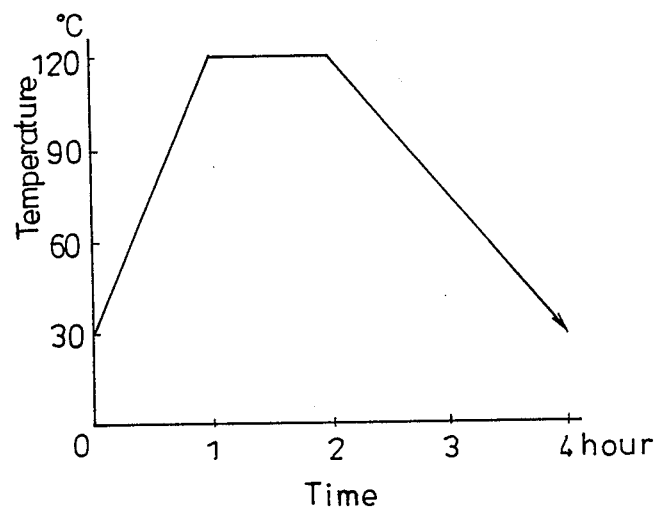
FIG. 27 is a graph showing a heating/cooling curve within a heating furnace.

④ While the same state is maintained, the entire members were charged in a heating furnace, they were heated up to a temperature 120° C. exceeding the setting temperature of the thermo-setting resin adhesive, and after the thermo-setting resin adhesive 34 was hardened, they were taken out of the furnace and cooled naturally, similarly to the heat treatment illustrated in FIG. 27.

Through the above-mentioned procedure, under the state where the adhesive layer thickness is made uniform over the entire circumference of the round bar 31, the thermo-setting resin adhesive 34 can be hardened, and also, owing to a difference in thermal contraction between the ribbon 33 and the thermo-setting resin adhesive 34, uniform isotropic compression strain can be given to the entire region of the ribbon 33 serving as a mechanical quantity sensor element.

The merits of this process exist in that ①  it is possible to attract and fix the ribbon 33 to the round bar 31 by means of magnetic forces generated uniformly along the outer circumference of the round bar 31 without bringing another member into contact with the round bar 31, and since the pressure generated between the round bar 31 and the ribbon 33 is uniform, the thickness of the thermo-setting resin adhesive layer 34 existing therebetween is also uniform; that ② the strength of the magnetic attracting force between the ribbon 33 and the round bar 31 can be adjusted by appropriately selecting the permanent magnets 32, and thereby countermeasure can be easily taken against a difference in the viscosity of the thermo-setting resin adhesive; and that ③ since the thickness of the thermo-setting resin adhesive layer after hardening becomes uniform, the flexed shape of the ribbon 33 can precisely conform to the outer circumference shape of the round bar 31, also the deformation produced on the outer circumference of the round bar 31 by the action of an external force can be correctly sensed by the ribbon 33, and hence an output deviation of a mechanical quantity sensor element can be suppressed to minimum.

Example 8

Figure 9:
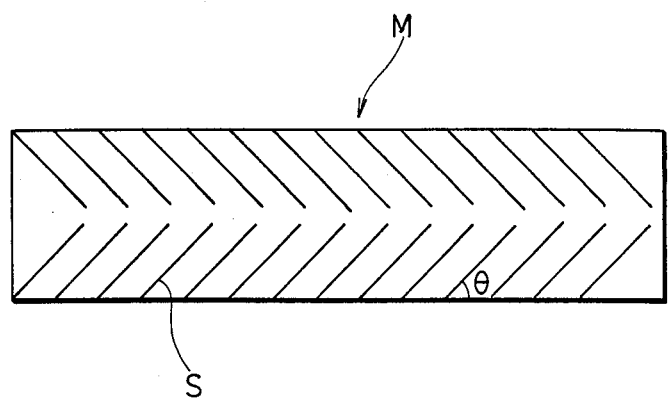
FIG. 9 is a schematic view showing a thin film sheet made of the above-mentioned noncrystalline magnetic alloy.

① A ribbon illustrated in FIG. 9 which is different from the ribbon 33 used in Example 7 above only in that a plurality of inclined slits (inclination angle=45°) which are parallel to each other are formed.

② All the other conditions are held equal to those in Example 7, and under the state where isotropic compression strain was preliminarily given, the above-mentioned ribbon was fixedly secured to an outer circumference of a round bar.

③ Subsequently, the arrangement illustrated in FIG. 11 was set up, and an induction voltage (V) generated across the detecting coils 3, 3 was investigated.

As described previously, this induction voltage (V) would vary according to variation of a magnetic permeability of the ribbon which corresponds to a noncrystalline magnetic alloy piece, that is, depending upon a magnitude of tensile strain introduced to the ribbon by a torque T applied to the round bar, and so, if the relation between a magnetic permeability and a torque T has been preliminarily examined, then a magnitude of a torque T can be known by measuring the induction voltage (V).

Example 9

Figure 29:
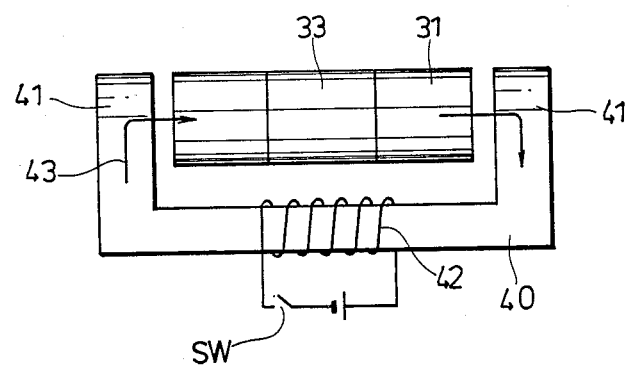

① A round bar 31 and a ribbon 33 which are similar to those used in Example 7 above were prepared, the ribbon 33 was wrapped around the outer circumference of the round bar 31 by means of a thermo-setting resin adhesive (an epoxy resin adhesive Alaldite XN 1244 (trade name) (coefficient of thermal expansion:$10 \times 10^{-5}/°$ C.) manufactured by Ciba-Geigy Co.), and they were charged in a heating furnace in a room temperature condition (See FIG. 29, but the heating furnace is not shown).

② On the furnace wall of the heating furnace is disposed a magnetic core 40 consisting of a plurality of U-shaped ferromagnetic sheets (for instance, silicon steel sheets) laminated on one another, a coil 42 connected to a D.C. power supply is wound around a base portion of the magnetic core 40, and the round bar 31 is positioned between end portions 41, 41 of the magnetic core 40.

Accordingly, the round bar 31 was applied with an external magnetic field (See line of magnetic force 43) which extends from one end to the other end, and by the action of the internal magnetic field produced in the round bar 31 and the ribbon 33, the ribbon 33 was attracted to the round bar 31 similarly to the case of Example 7.

③ While maintaining that state, the temperature of the heating furnace was raised, thereby the thermo-setting resin adhesive layer was hardened, and then the temperature was lowered according to the heating-/cooling curve in FIG. 27.

Through the above-described procedure, the ribbon 33 which was given isotropic compression strain could be wrapped around and fixed to the outer circumference of the round bar 31.

This process has the merits that ① a magnitude of the external magnetic field is varied depending upon a magnitude of the current passed through the coil 42, and thereby a magnitude of the magnetic attraction force between the ribbon 33 and the round bar 31 can be adjusted, and that ② the external magnetic field can be applied to or removed from the round bar 31 charged in the heating furnace at any arbitrary timing by manipulating an electric switch SW.

Example 10

This example is a modification of Example 9 above, and it differs from Example 9 only in the shape of the magnetic core 40A consisting of a plurality of ferromagnetic sheets (for instance, silicon steel sheets) laminated on one another, and in that respective coils 42, 42 were wrapped around the respective end portions 41A, 41A. The magnetic field (line of magnetic force 43) generated by this magnetic circuit structure 45 is larger then that in Example 7 (See FIG. 30).

Example 11

This example is a modification of Example 7 above, and it differs from Example 7 in that a pair of permanent Magnets 32B, 32B were connected to each other through a yoke member 44 consisting of a plurality of ferromagnetic sheets (for instance, silicon steel sheets) laminated on one another and thereby a magnetic circuit structure 45 was constructed (See FIG. 31).

While a thermo-setting resin adhesive was employed as means for mounting the ribbon 33 to the circumference of the round bar 31 in the above-described respective examples, the ribbon 33 can be mounted even by means of a simple tacky material. In this case the thickness of the layer of the tacky material is made to be uniform by making use of a magnetic attracting force, and the configuration of the outer circumferential surface of the round bar 31 can be correctly reproduced by the ribbon 33.

What is claimed is:

1. A mechanical quantity sensor element making use of a stress-magneto effect of noncrystalline magnetic alloy having positive magnetostriction, wherein a noncrystalline magnetic alloy piece is coupled or contactedly engaged with another material, and at least a part of said noncrystalline magnetic alloy piece having a preliminary compression strain as a result of mutual correlation between the both materials, whereby said mechanical quantity sensor element presents a stress-magneto characteristic having an excellent linearity and an enlarged detectable range for mechanical quantities.

2. A mechanical quantity sensor element as claimed in claim 1, wherein said another material is thermo-setting resin.

3. A mechanical quantity sensor element as claimed in claim 2, wherein a plurality of ribbons made of noncrystalline magnetic alloy are integrally laminated via a thermo-setting resin adhesive layer, and isotropic compression strain is given to the respective ribbons as a result of the laminated and jointed relationship.

4. A sensor element comprised of a noncrystalline magnetic alloy piece and means joined thereto causing compression strain in at least a portion of said piece for producing improved stress-magneto characteristics of said piece.

* * * * *